(12) United States Patent
Yamada

(10) Patent No.: US 6,721,427 B1
(45) Date of Patent: Apr. 13, 2004

(54) ANALOG FILTER FOR DIGITAL AUDIO SYSTEM AND AUDIO AMPLIFIER FOR USING THE SAME

(75) Inventor: Kazutoshi Yamada, Sakai (JP)

(73) Assignee: Zanden Audio System Co., Ltd., Sakai (JP)

( * ) Notice: Subject to any disclaimer, the term of this patent is extended or adjusted under 35 U.S.C. 154(b) by 857 days.

(21) Appl. No.: 09/588,381

(22) Filed: Jun. 7, 2000

(30) Foreign Application Priority Data

Jun. 8, 1999 (JP) .......................................... 11-161249

(51) Int. Cl.⁷ .............................................. G10K 11/36
(52) U.S. Cl. ..................... 381/71.14; 341/110; 708/322
(58) Field of Search ................................ 708/300, 322; 455/103–105, 114.1–114.3, 296, 307, 339; 341/108, 110, 118, 144, 155; 381/71.1, 71.11–71.14, 73.1, 94.1, 97–103, 120

(56) References Cited

U.S. PATENT DOCUMENTS

| | | | |
|---|---|---|---|
| 4,347,408 A | * 8/1982 | Ito et al. | 340/825.74 |
| 4,542,369 A | * 9/1985 | Kasuga | 341/144 |
| 5,068,716 A | * 11/1991 | Takayama et al. | 348/708 |
| 5,420,585 A | 5/1995 | Adams | 341/118 |
| 5,602,762 A | * 2/1997 | Lyon | 702/190 |
| 5,661,487 A | * 8/1997 | Targoff | 342/101 |
| 5,926,065 A | * 7/1999 | Wakai et al. | 329/304 |
| 6,023,611 A | * 2/2000 | Bolin et al. | 455/114.1 |
| 6,492,922 B1 | * 12/2002 | New | 341/120 |
| 2003/0095201 A1 | * 5/2003 | Devaney et al. | 348/384.1 |

FOREIGN PATENT DOCUMENTS

| | | |
|---|---|---|
| JP | 49-106751 A | 10/1974 |
| JP | 58-159628 U | 10/1983 |
| JP | 2-54624 A | 2/1990 |

OTHER PUBLICATIONS

Satoru Imada, Toranjisuta Gijyutsu, Feb., 1988, pp. 340–345.

* cited by examiner

Primary Examiner—Maria N. Von Buhr
(74) Attorney, Agent, or Firm—Smith Patent Office

(57) ABSTRACT

An analog filter is connected at the output of a D/A converter. The analog filter eliminates higher frequency components than the original basic frequencies for a digital audio system and improves the phase characteristic. The analog filter comprises a plurality of band elimination filters that have respective cutoff frequencies of integral multiples of the sampling frequency $f_s$. An audio amplifying circuit is connected to the analog filter. Each band elimination filter eliminates side band components close to integral multiples of the sampling frequency. By such construction, the analog filter has the necessary amplitude characteristic and lessens phase shift within the basic frequency.

15 Claims, 17 Drawing Sheets

ANALOG FILTER FOR DIGITAL AUDIO SYSTEM AND AUDIO AMPLIFIER FOR USING THE SAME

BACKGROUND OF THE INVENTION

1. Field of the Invention

The present invention relates to an analog filter and an audio amplifier using the analog filter. The filter is used in a digital audio system to reproduce original audio signals having a basic frequency component and to eliminate unnecessary harmonic components.

2. Discussion of the Related Art

In a digital audio system, an analog to digital converter (hereinafter referred to as an A/D converter) is used at the first stage of a digital audio system, where the audio signal is changed to a digital signal. A digital to analog converter (hereinafter refers to as a D/A converter) is used at the final output stage in order to convert the digital signal to an analog signal. The output signal from the D/A converter contains higher frequency harmonic components than the output signal from the A/D converter. The output signal contains a basic frequency component up to a frequency of 20 kHz, as well as upper and lower side band components of the integral multiples of the sampling frequency $f_s$. In a digital audio system, a low pass filter is indispensable to eliminate frequency components higher than the sampling frequency and to reproduce its basic component up to 20 kHz.

The most common music medium for recording is the compact disc. In a compact disc system, the upper limit of the basic frequency is 20 kHz and the sampling frequency is 44.1 kHz. Thus, there are unnecessary side band components close to the upper limit of the basic frequency. If these unnecessary components are reproduced by a speaker system, cross modulation distortion may occur, or a tweeter may be damaged. In addition, some people may hear these unnecessary side band components in the music. The low pass filter is used to eliminate such unnecessary components higher than 20 kHz.

However, the lowest frequency of the unnecessary side band, 24.1 kHz, is close to the highest frequency of the basic component. A low pass filter having very sharp attenuation can be used to eliminate unnecessary frequency components. For example, some compact disc players have an analog low pass filter of a high order, such as a Tchebyscheff-type low pass filter of the 11th order.

FIG. 1A shows an example of a circuit diagram of the Tchebyscheff-type low pass filter 100 of the 11th order, whose cutoff frequency is 20 kHz. FIG. 2 shows the amplitude and phase characteristics of the low pass filter. As shown in this Figure, the amplitude characteristic represented by the dotted line is almost flat up to around 20 kHz. However, as shown by the solid line, the phase shift gradually increases within the range of 200 Hz to 9 kHz, and fluctuates dramatically at a frequency of 9 kHz and higher. This phase shift can cause serious negative effects in the high fidelity audio equipment.

In an attempt to solve this problem, an over sampling technique is used. In over sampling, a digital filter is installed in front of a D/A converter, where the frequency component that is higher than the basic frequency is cut off by the digital filter. Then the digital signal is converted to an analog signal at a frequency of integral multiples of the sampling frequency. Thereafter, an analog low pass filter of a lower order, such as a second or third order, attenuates harmonic components of higher frequency. FIG. 1B shows a low pass filter 110 of the third order which is used at the output stage of a four times over sampling circuit having a cutoff frequency of 80 kHz.

Further, FIG. 3 shows the characteristics of the low pass filter. As shown in FIG. 3, the phase shift gradually increases and reaches 30° at 20 kHz. Such a phase shift can cause negative influences on high fidelity audio equipment.

It is very important to improve not only the frequency characteristic but also the phase characteristic to reproduce a high fidelity audio signal. If the phase characteristic is poor, high fidelity sound cannot be obtained. These problems have not yet been solved in any conventional digital audio system.

SUMMARY OF THE INVENTION

The present invention solves the problems associated with low pass filters connected to a D/A converter. Thus, an object of the invention is to provide an analog filter that has an improved phase characteristic as well as an improved amplitude characteristic within the basic frequency.

The analog filter of the present invention can be connected to a digital to analog converter, which converts digital signals sampled, at a specified sampling frequency $f_s$, to an analog signal for a digital audio system. The filter comprises a number n of band elimination filters having cutoff frequencies of $f_s \pm \Delta f$, $2f_s \pm \Delta f$, $3f_s \pm \Delta f$, $nf_s \pm \Delta f$, respectively, where n is a natural number.

DETAILED DESCRIPTION OF THE PREFERRED EMBODIMENTS

Figure 1A:
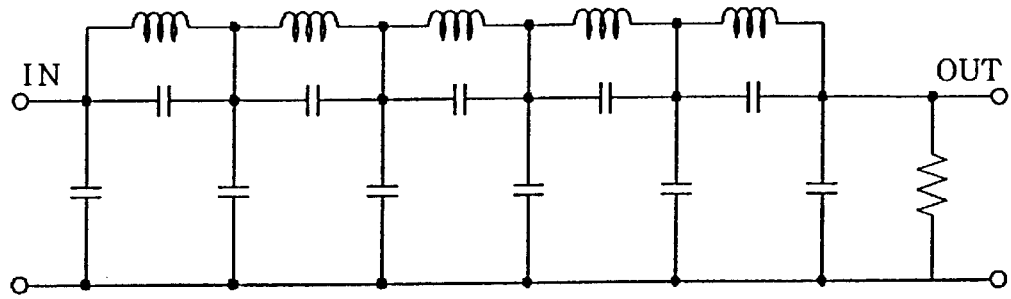
FIG. 1A and FIG. 1B are block diagrams of analog filters for digital audio systems according to a conventional digital audio system.
Figure 1B:
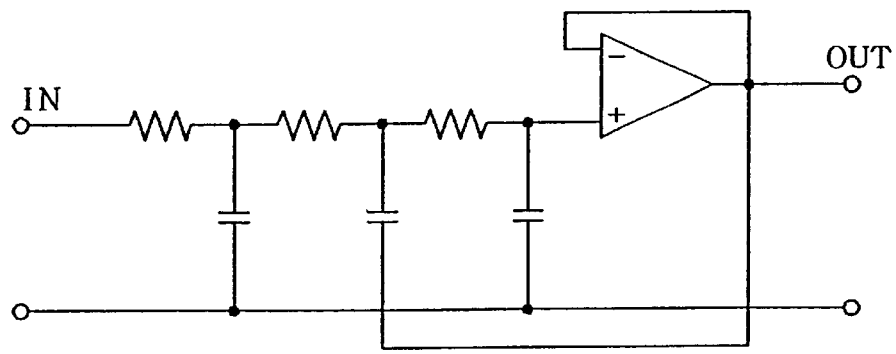
Figure 2:
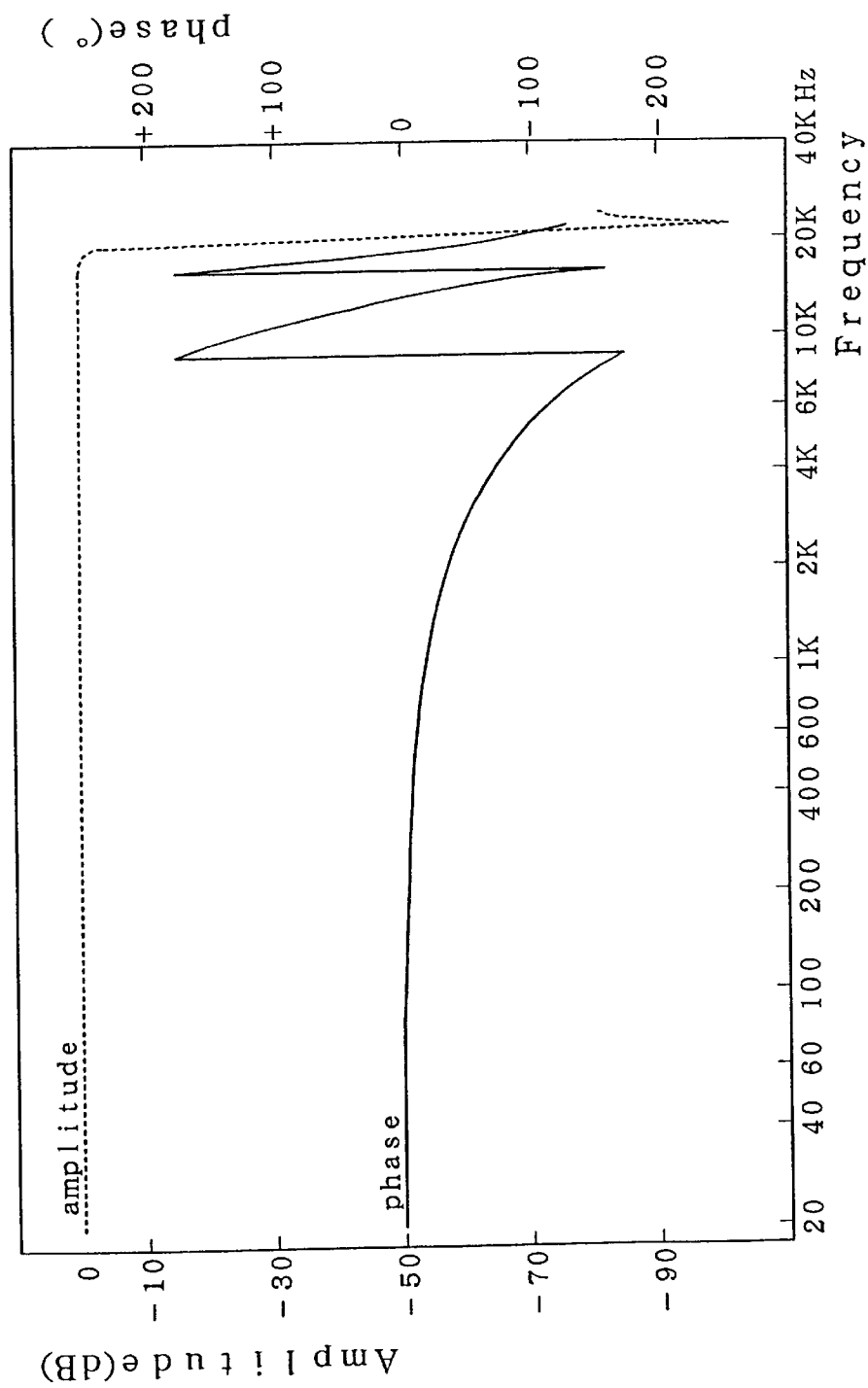
FIG. 2 is a graph of the frequency and phase characteristics of the conventional low pass filter.
Figure 3:
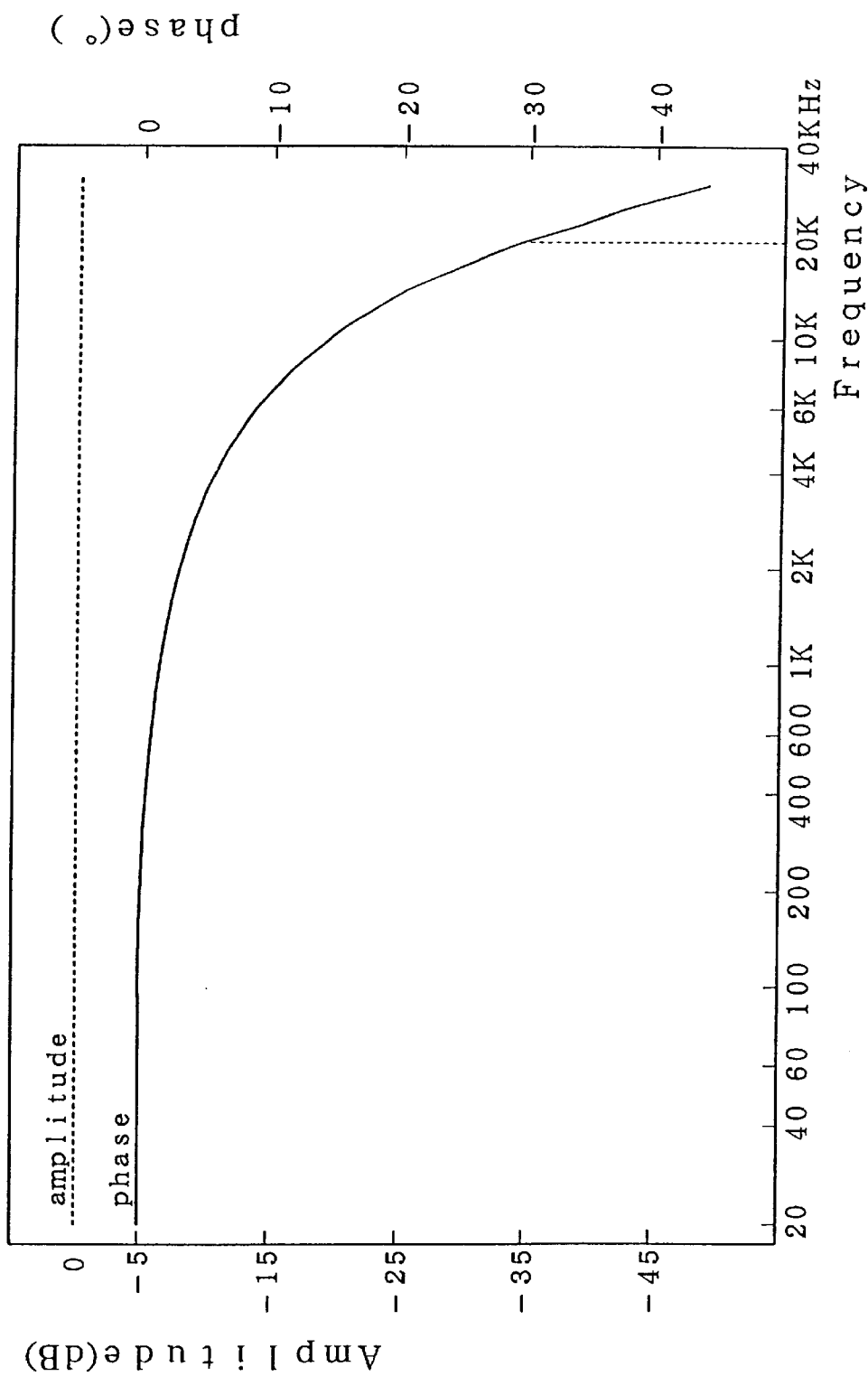
FIG. 3 is a graph of the frequency and phase characteristics of a conventional low pass filter using an over sampling technique.
Figure 4A:
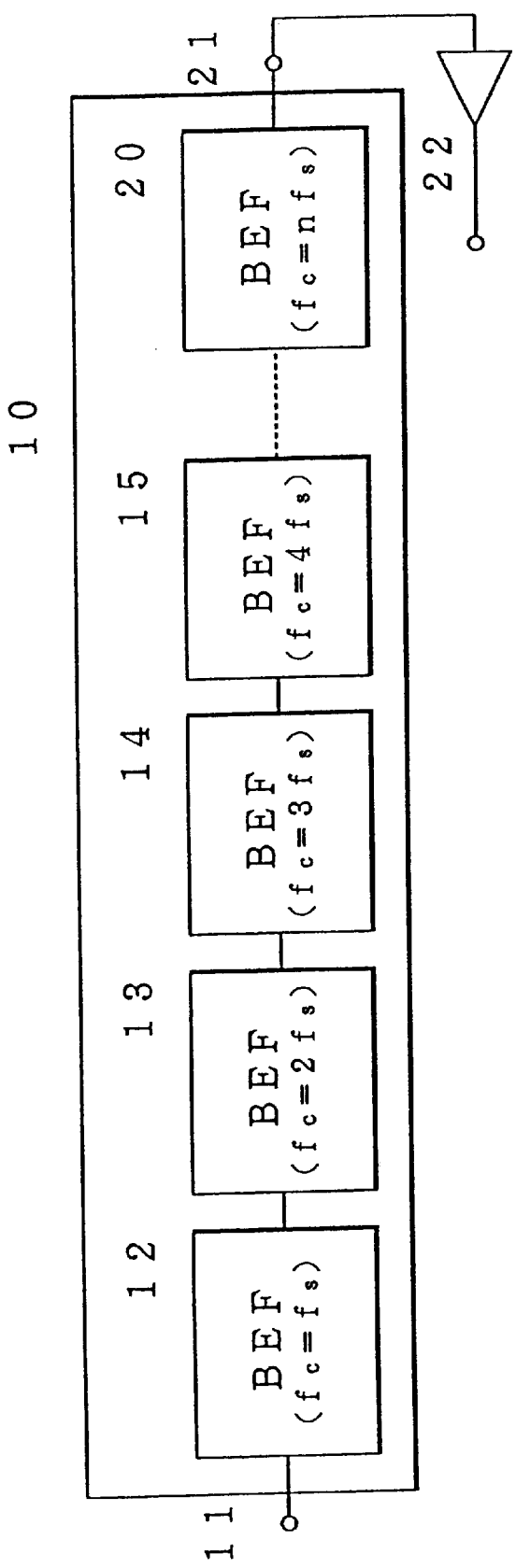
FIG. 4A is a block diagram of an analog filter for digital audio systems according to a first embodiment of the present invention.

With respect to FIG. 4A, the original analog signal is converted to digital data by an A/D converter (not shown) at a sampling frequency $f_s$. Then, a digital audio system transmits or stores the data. Finally the data is converted to an analog signal by a D/A converter (not shown). The analog signal converted by the D/A converter is fed to the input terminal 11 of an analog filter 10. The analog filter 10 is comprised of a plurality of band elimination filters (BEF) 12, 13, 14, 15, ... 20 connected in series. An audio amplifier circuit 22 is connected to the output terminal 21 of the band elimination filter 10.

The center cutoff frequency $f_c$ of the band elimination filter 12 is set to equal the sampling frequency $f_s$ of the digital signal delivered from the D/A converter. For example, if the sampling frequency is 44.1 kHz, then the center cutoff frequency is also 44.1 kHz. The center cutoff frequencies $f_c$ of the band elimination filters 13, 14, 15, ... 20 are integral multiples of the sampling frequency, namely $2f_s, 3f_s, 4f_s, \ldots nf_s$, respectively, where n is a natural number.

The band elimination filters are used to eliminate the upper and lower side bands of the integral multiples of the sampling frequency. Since the filters can eliminate the upper and lower side band components, the center cutoff frequencies of the filters do not coincide precisely with integral multiples of the sampling frequency. Therefore, the cutoff frequencies of the band elimination filters 12, 13, 14, ... can be $f_s \pm \Delta f, 2f_s \pm \Delta f, 3f_s \pm \Delta f, nf_s \pm \Delta f$, respectively, wherein n is a natural number. Preferably, the frequency $\Delta f$ is less than 1 kHz.

Figure 5:
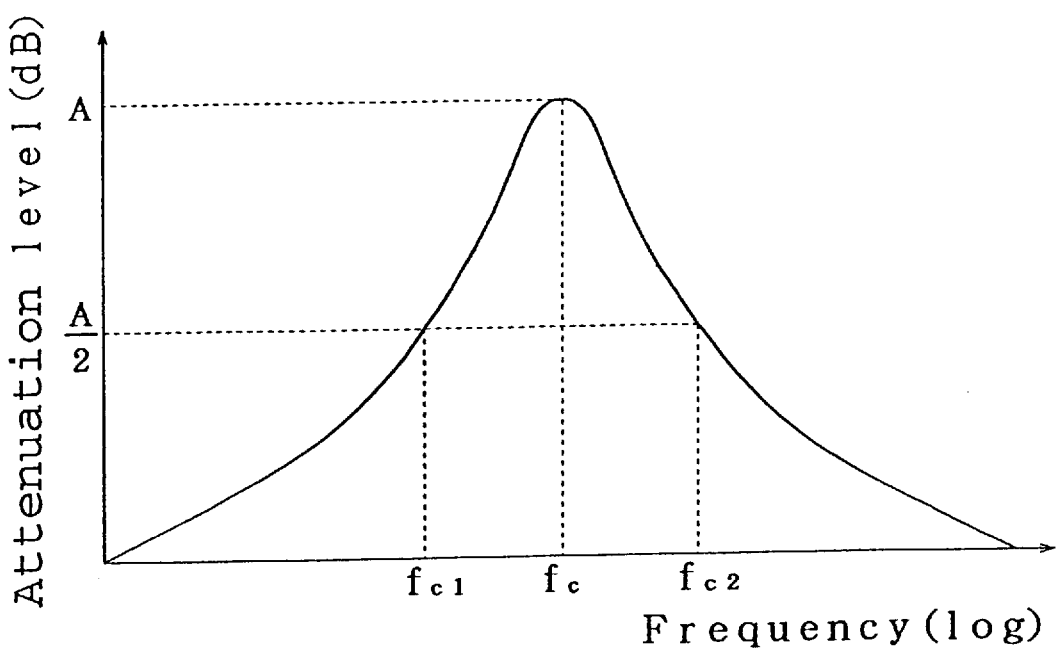
FIG. 5 is a graph of the frequency characteristics of the band elimination filter of the first and second embodiments.

FIG. 5 shows an attenuation characteristic of one of the band elimination filters. The band elimination filter 12, which has the lowest cutoff frequency, is preferred. After that, the band elimination filter 13 is useful, then the filter 14 and so on. The use is based on the order of the natural number n. However, the placement of the filters is not particularly limited. The number of band elimination filters and the attenuation characteristics are decided on the basis of the frequency characteristic of the audio amplifier circuit 22 connected to the output terminal 21.

Figure 6A:
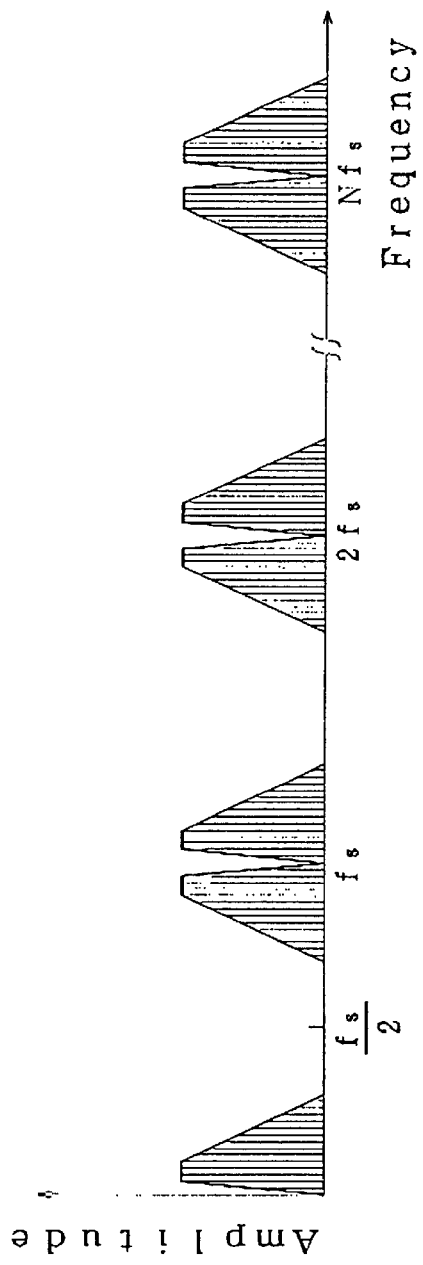
FIG. 6A is a graph of the frequency spectrum of an input signal fed to the analog filter after the D/A conversion.
Figure 7:
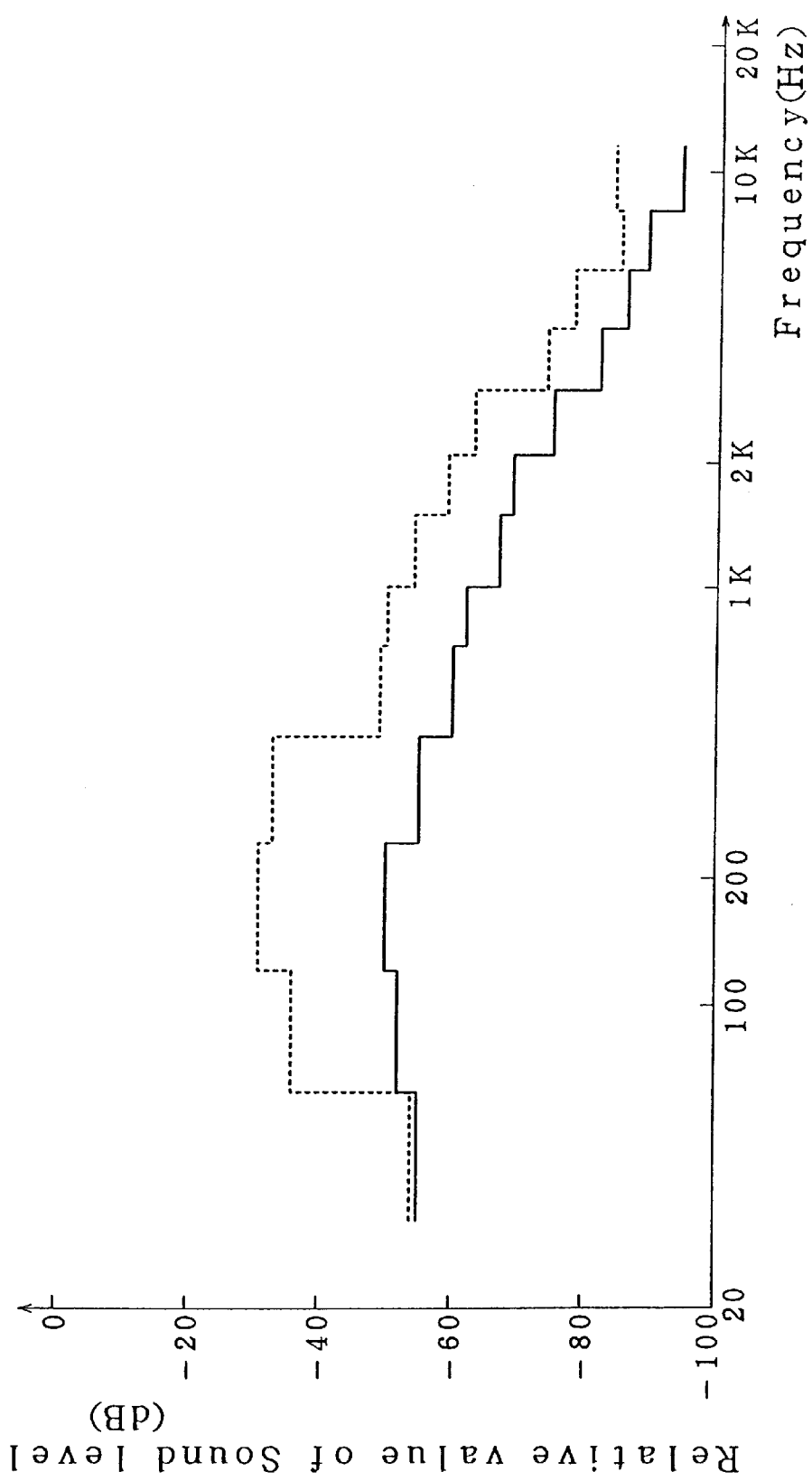
FIG. 7 is a graph of the frequency spectrum of an audio signal having one of the widest conceivable frequency ranges.

FIG. 6A shows the frequency characteristics delivered to the input terminal 11 of the analog filter 10 after the D/A conversion. With respect to FIG. 7, if the input signal, for example, is the sound of a large-scale orchestra that has the widest frequency spectrum, the mean level over a long time is as shown in FIG. 7. The dotted line shows connected peak values of each frequency component, and the solid line shows connected root mean square values. In this Figure, the frequency component over 10 kHz is less than the peak value by 40 dB. Therefore, the spectrum of the input signal added to the input terminal 11 is concentrated on frequency ranges close to integral multiples of the sampling frequency, as shown in FIG. 6A. In the present embodiment, in order to pass the basic frequency component and to eliminate higher frequency components, in the present embodiment, series-connected band elimination filters 12, 13, . . . are used instead of the low pass filters used in conventional analog filters.

Generally speaking, since basic bands of usual music sources are narrower than that of large-scale orchestras, the widths of the side bands spectrum are also narrower than those of FIG. 7. At least a 5 kHz elimination at the center of integral multiples of the sampling frequency can satisfy the amplitude characteristics.

Figure 6B:
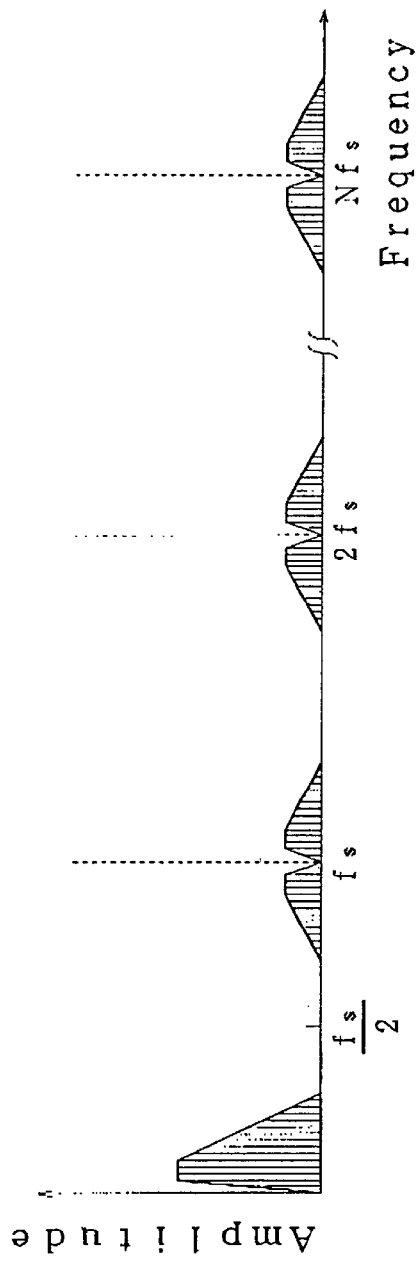
FIG. 6B is a graph of the frequency spectrum of the output signal.

FIG. 6B shows the frequency spectrum of the output signal. Such filters eliminate frequency components above the frequency of $f_s/2$ to a negligible level. In the central frequencies of the band elimination filters, since the frequency $f_s$ is the closest to the basic frequency, the phase characteristic does not fluctuate as heavily as the conventional phase characteristic. Therefore, the output signal of the audio amplifying circuit 22 can be greatly improved.

Figure 4B:
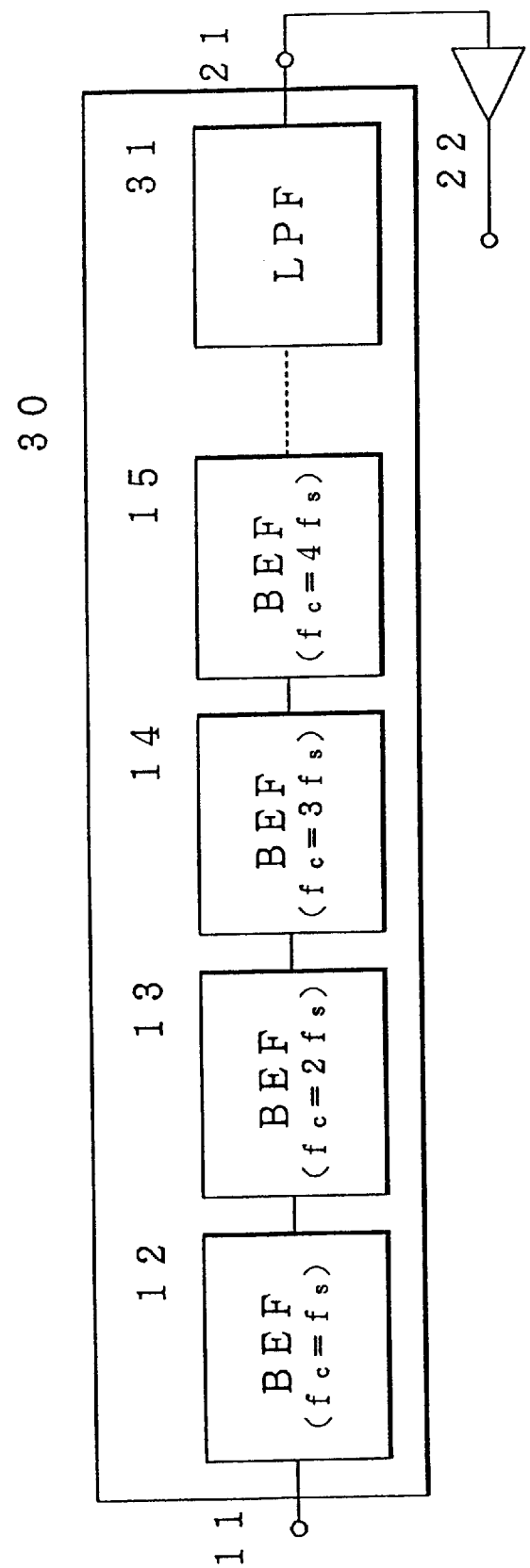
FIG. 4B is a block diagram of an analog filter for digital audio systems according to a second embodiment of the present invention.

Next, a second embodiment of the present invention is described below with reference to FIG. 4B. The analog filter 30 of this embodiment comprises a plurality of band elimination filters 12, 13, 14, . . . , and a low pass filter (LPF) 31. The cutoff frequency of the low pass filter 31 is selected to be at least twice the sampling frequency $f_s$ or more, more preferably three times or more, and further more preferably 4 or 5 times or more. In this embodiment, the low pass filter 31 is used at the final stage. The low pass filter 31 is a filter of a low order, and the cutoff frequency thereof is selected to be as high as possible. As a result, it imparts a few undesired effects to the phase characteristic of the basic frequency component. In addition, in this embodiment, the number of band elimination filters can be reduced so that circuit construction can be simplified. Thus, in this embodiment, the output signal of the audio amplifier 22 connected to the output terminal of the analog filter can be greatly improved.

Figure 8:
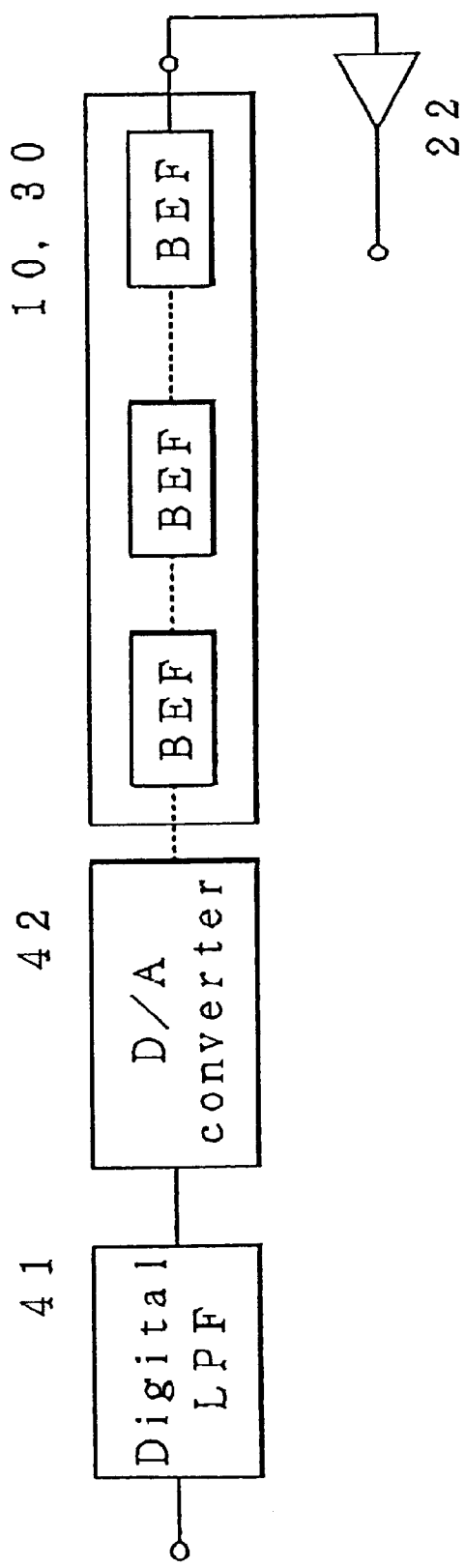
FIG. 8 is a block diagram of an analog filter for digital audio systems according to a third embodiment of the present invention.

A third embodiment of the present invention is described below with reference to FIG. 8. In the abovementioned first and second embodiments, the analog filter is connected to the output terminal of the D/A converter, but the analog filter of the present invention can be applied when using the over sampling method. As shown in FIG. 8, a digital low pass filter 41 is used to eliminate frequency components higher than the basic band. The cutoff frequency of the filter 41 is selected at a frequency, for example 26 kHz, which is approximately the same as the frequency $f_s$.

A D/A converter 42 is connected at the output terminal of the filter 41. The D/A converter 42 converts the audio signal to a digital signal at an over sampling frequency, such as 192 kHz. The analog filter 10 or 30 and the audio amplifier circuit 22 of the present embodiment are connected to the D/A converter 42. In this example, the sampling frequency $f_s$ is the over sampling frequency, namely 192 kHz. In this embodiment, the phase delay is lessened to improve sound quality.

The analog filters of the above embodiments are described with reference to a compact disc system. It is noted, however, that the present invention is applicable to any digital audio system, such as a DVD or MPEG audio system.

Concrete examples of the present invention are described below.

EXAMPLE 1

Figure 9:
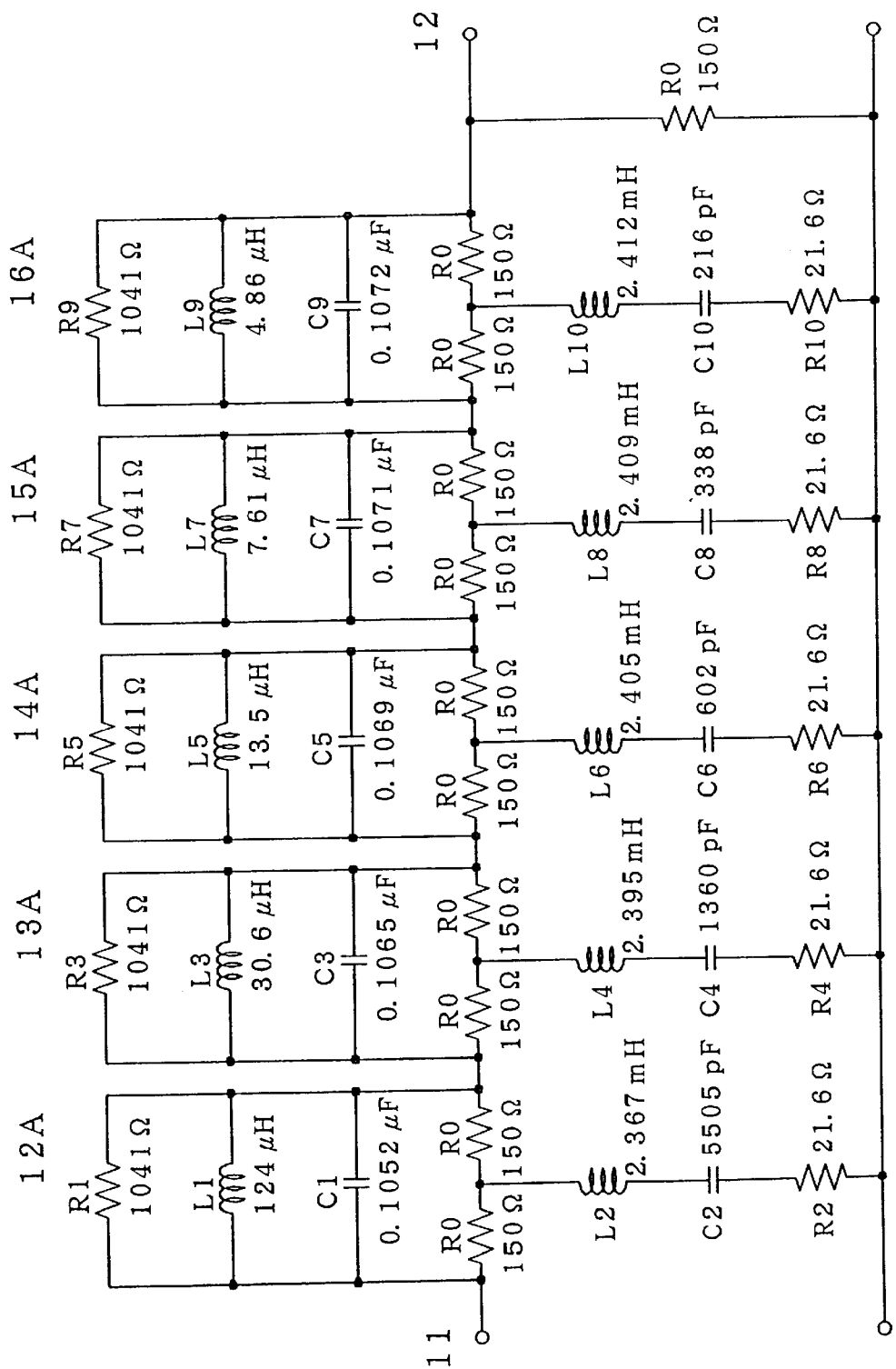
FIG. 9 is a circuit diagram of an analog filter of Example 1 of the first embodiment.

This is an example of an analog filter of the first embodiment of the present invention. FIG. 9 shows a circuit diagram of Example 1. The analog filter is composed of five band elimination filters 12A to 16A. Each band elimination filter is a constant resistor circuit. The first filter 12A comprises two series connected resistors R0, a parallel connection body, and a series connection body. The parallel connection body is composed of a capacitor C1, a coil L1, and a resistor R1 that are connected in parallel to the resistors R0. The series connection body is composed of a coil L2, a capacitor C2, and a resistor R2, and it is connected between the connecting point of the resistors R0 and the ground.

Other filter circuits 13A to 16A have the same structure as that of the filter 12A. The filter 13A comprises two series connected resistors R0, a parallel connection body comprising a capacitor C3, a coil L3 and a resistor R3, and a series connection body comprising a coil L4, a capacitor C4 and a resistor R4. Other filter circuits are as shown in FIG. 9. The band elimination filters of the constant resistor circuit can be connected in series.

The values of the passive elements of the filter 12A are determined as follows:

$$k = f_{c1}/f_c$$

$$L1 = \frac{1-k^2}{k} \cdot \frac{10^{\frac{A}{20}}-1}{10^{\frac{A}{40}}} \cdot \frac{R0}{2\pi f_c}$$

$$R1 = \left(10^{\frac{A}{20}}-1\right)R0$$

$$C1 = \frac{k}{1-k^2} \cdot \frac{10^{\frac{A}{40}}}{10^{\frac{A}{20}}-1} \cdot \frac{1}{2\pi f_c R0}$$

$$R2 = \frac{R0^2}{R1}$$

$$C2 = \frac{L1}{R0^2}$$

where, Z is the characteristic impedance, $f_c$ is the central cutoff frequency, A is the maximum elimination rate, and $f_{c1}$ is the frequency at the elimination rate A/2.

For example, if the sampling frequency $f_s$ is 44.1 kHz, the center cutoff frequency $f_c$ of the first filter is $f_s$, the maximum elimination rate A is 18 dB, the frequency $f_{c1}$, at the elimination rate A/2 is 42.1 kHz, and the characteristic impedance is 150 Ω, using these levels, the values of each of the elements are as shown in FIG. 9. The values of the passive elements of the filters 13A, 14A, 15A, and 16A can also be determined in the same way.

Figure 10:
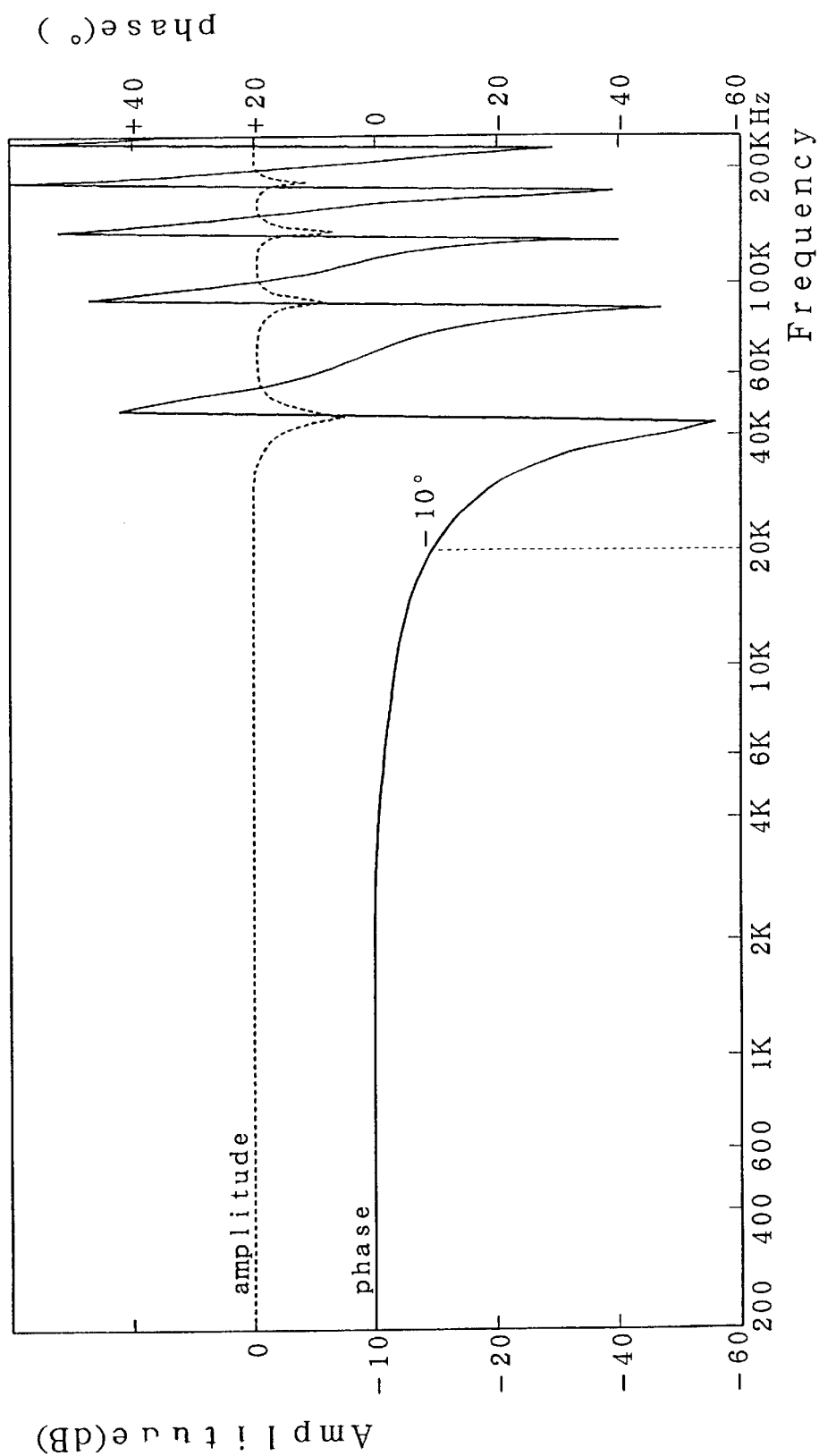
FIG. 10 is a graph of the frequency and phase characteristics of the analog filter of Example 1.

FIG. 10 shows the amplitude and phase characteristics of the analog filter of Example 1. The amplitude characteristic is sufficiently low around the sampling frequency and frequencies of the integral multiples thereof. In this way, the higher component of the inputted signal is eliminated effectively. With regard to the phase characteristic, the phase shift is only −10° at 20 kHz. Thus, the phase characteristic is remarkably improved as compared with a conventional analog filter.

EXAMPLE 2

Figure 11:
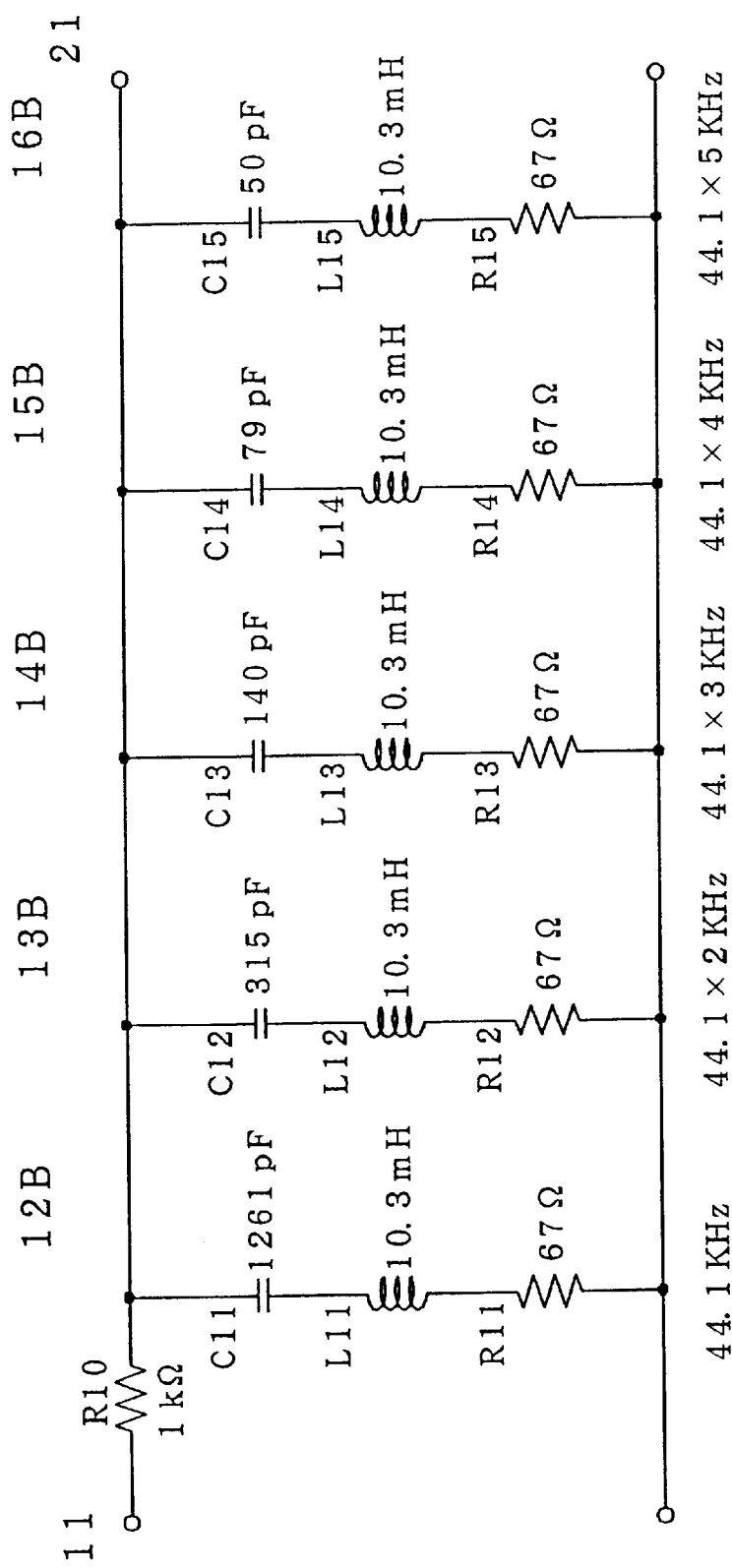
FIG. 11 is a circuit diagram of an analog filter of Example 2 of the first embodiment.

Example 2 is an analog filter of the first embodiment of the present invention. The analog filter of Example 2 is composed of five band elimination filters 12B to 16B as shown in FIG. 11. Each band elimination filter is a series resonance circuit. The first band elimination filter 12B comprises a capacitor C11, a coil L11, and a resistor R11. The band elimination filter 13B also comprises a capacitor C12, a coil L12, and a resistor R12. Other filter circuits are constructed in the same way. These band elimination filters 12B to 16B are a series resonance circuit having cutoff frequencies of $f_s$, $2f_s$, $3f_s$, $4f_s$, and $5f_s$, respectively. The input resistor R10 is connected between the terminals 11 and 21. The values of these passive elements of the filter 12B are determined as follows.

$$k = f_{c1}/f_c$$

$$L11 = \frac{1}{\sqrt{10^{\frac{A}{20}}-1}} \cdot \frac{R10}{4\pi(1-k)f_c}$$

$$R11 = \frac{R0}{10^{\frac{A}{20}}-1}$$

$$C11 = \sqrt{10^{\frac{A}{20}}-1} \cdot \frac{1-k}{\pi f_c R10}$$

where, Z is the characteristic impedance, $f_c$ is the central frequency, A is the maximum elimination rate, and $f_{c1}$ is the frequency at the elimination rate A/2.

For example, if the sampling frequency $f_s$ is 44.1 kHz, the center cutoff frequency $f_c$ of the filter is $f_s$, the maximum elimination rate A is 24 dB, and the frequency $f_{c1}$, at the elimination rate A/2 is 42.1 kHz, the characteristic impedance Z is 1 kΩ, then the values of each element are as shown in FIG. 11. The values of other band elimination filters 13B to 16B can also be determined in the same way as shown in FIG. 11.

Figure 12:
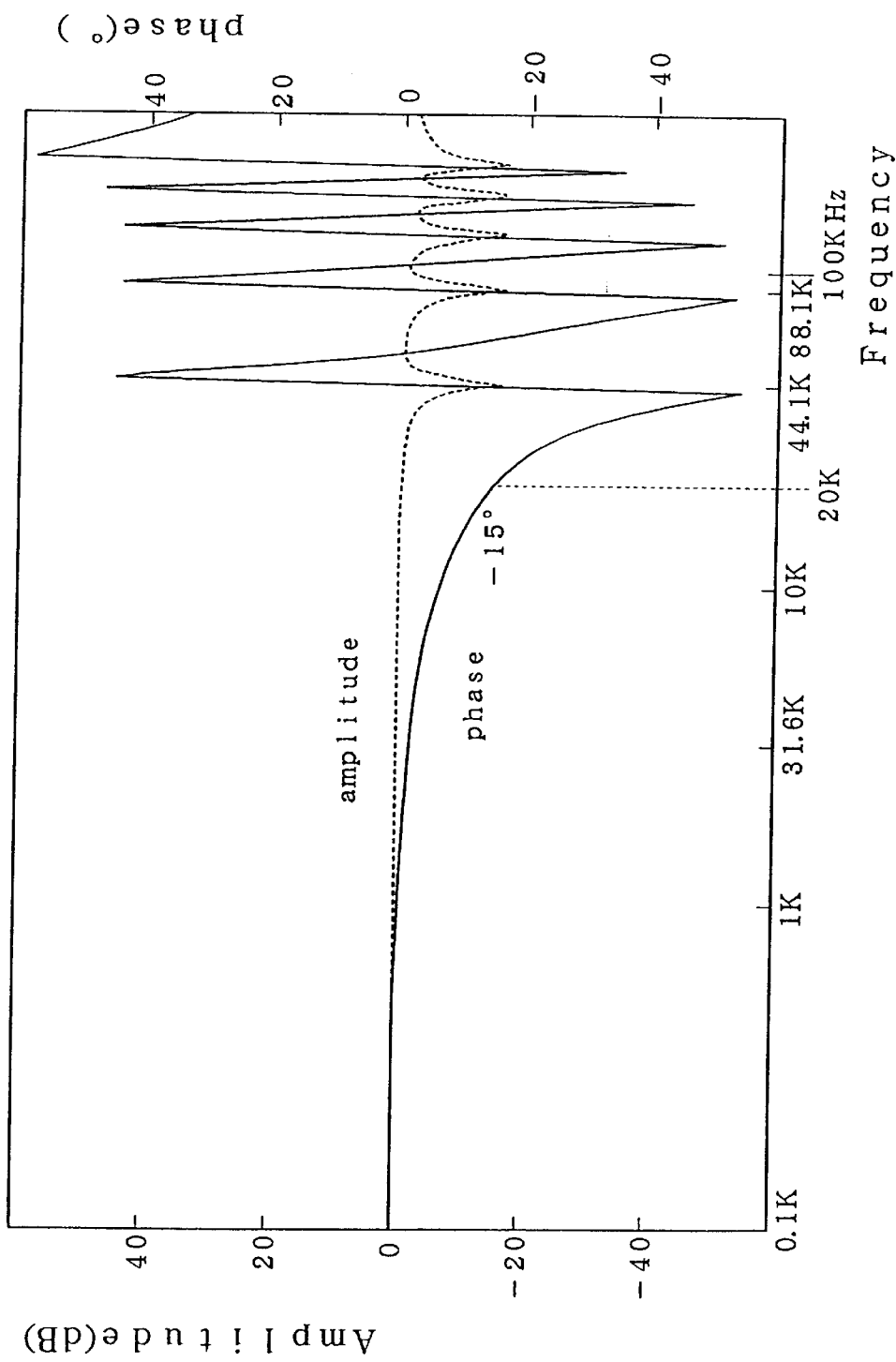
FIG. 12 is a graph of the frequency and phase characteristics of the analog filter of Example 2.

FIG. 12 shows the amplitude and phase characteristics of the analog filter of Example 2. In this example, the amplitude characteristic is sufficiently low around the sampling frequency and frequencies of the integral multiples thereof. With regard to the phase characteristic, the phase does not largely fluctuate up to 40 kHz, and the phase shift is small below 20 kHz, and only −15° at 20 kHz. Thus, the phase characteristic is remarkably improved as compared with a conventional analog filter.

EXAMPLE 3

Figure 13:
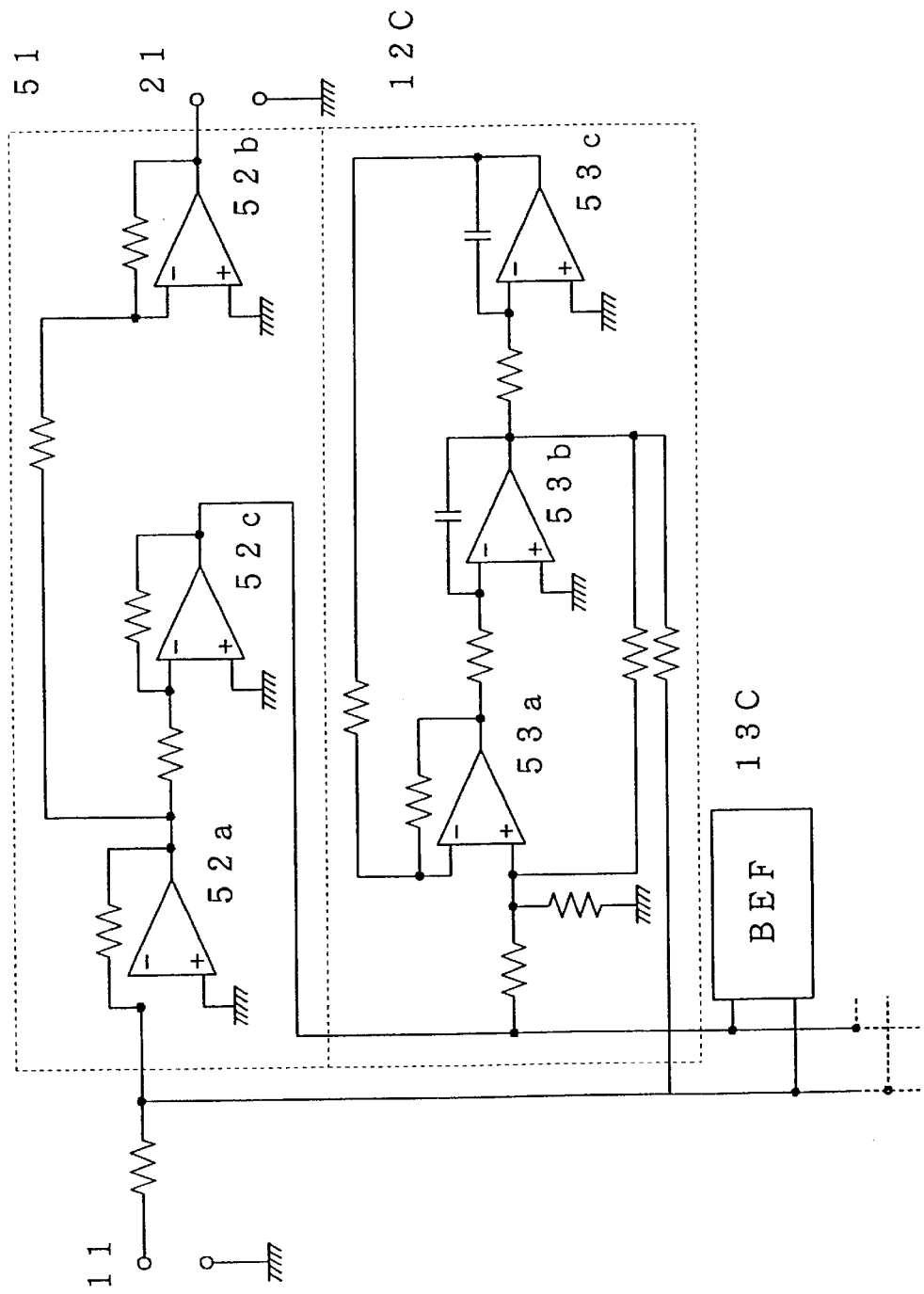
FIG. 13 is a circuit diagram of an analog filter of Example 3 of the first embodiment.

Example 3 is an analog filter of the first embodiment of the present-invention. In this example, as shown in FIG. 13, the analog filter comprises a buffer amplifier 51 and five band elimination filters 12C, 13C, . . . 16C. The buffer amplifier 51 has operational amplifiers 52a, 52b and 52c and it is connected between the input and output terminals 11 and 21. The band elimination filters 12C, 13C, . . . 16C are state valuable type active filters and are connected in parallel to the operational amplifier 52c of the buffer amplifier 51. The center cutoff frequencies $f_c$ of the filters 12C, 13C . . . are frequencies of $f_s$, $2f_s$, $3f_s$, $4f_s$, and $5f_s$, respectively. Each filter is an active filter having three operational amplifiers 53a to 53c, respectively.

Figure 14:
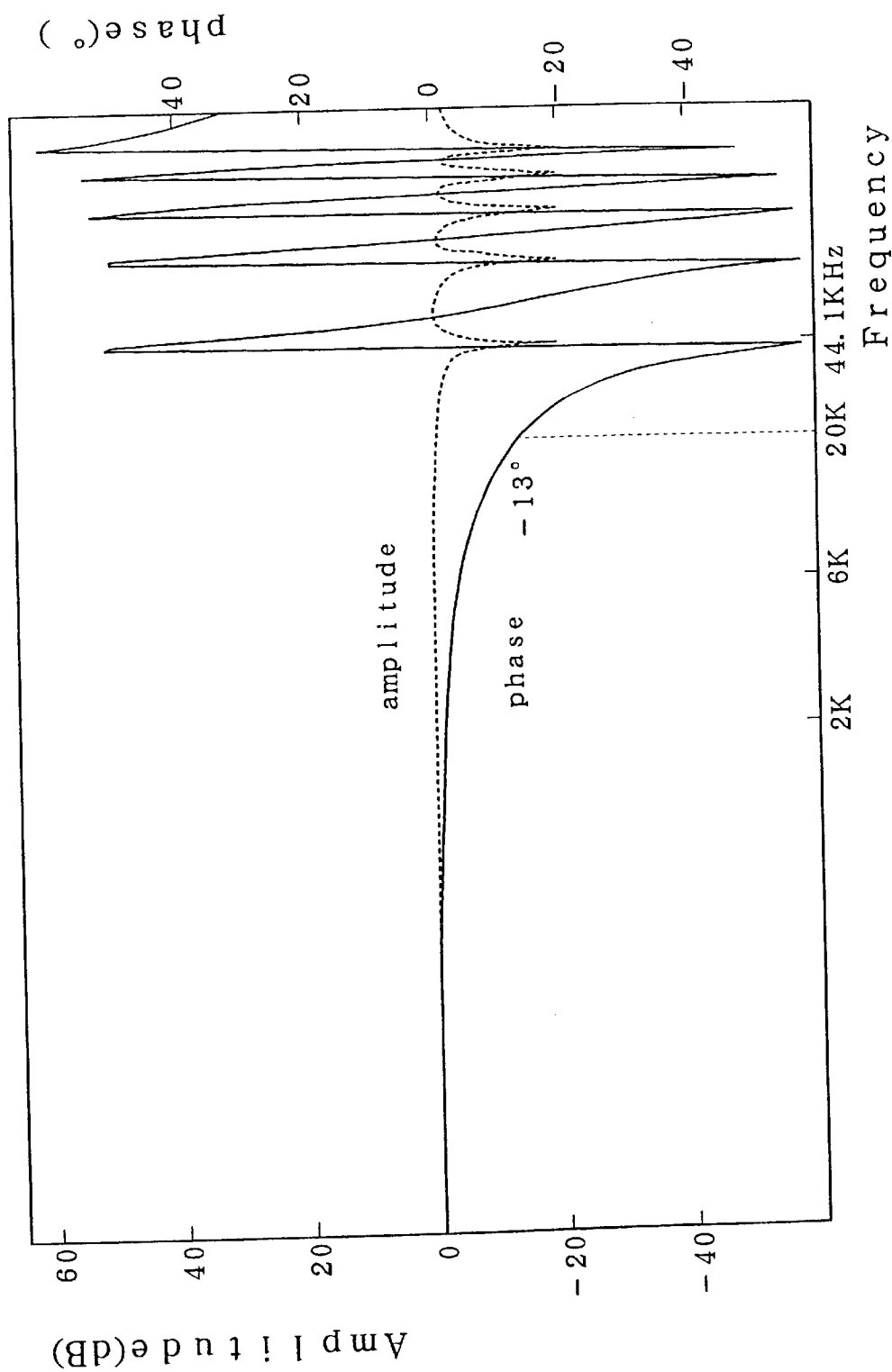
FIG. 14 is a graph of the frequency and phase characteristics of the analog filter of Example 3.

The characteristics of the analog filter are shown in FIG. 14. In Example 3, the amplitude characteristic is sufficiently low around the sampling frequency and frequencies of the integral multiples thereof. With regard to the phase characteristic, the phase does not largely fluctuate up to 40 kHz, and the phase shift is small below 20 kHz, and only −13° at 20 kHz. Thus, the phase characteristic is remarkably improved as compared with conventional analog filters.

EXAMPLE 4

Example 4 is an analog filter of the second embodiment of the present invention. In this example, as shown in FIG.

Figure 15:
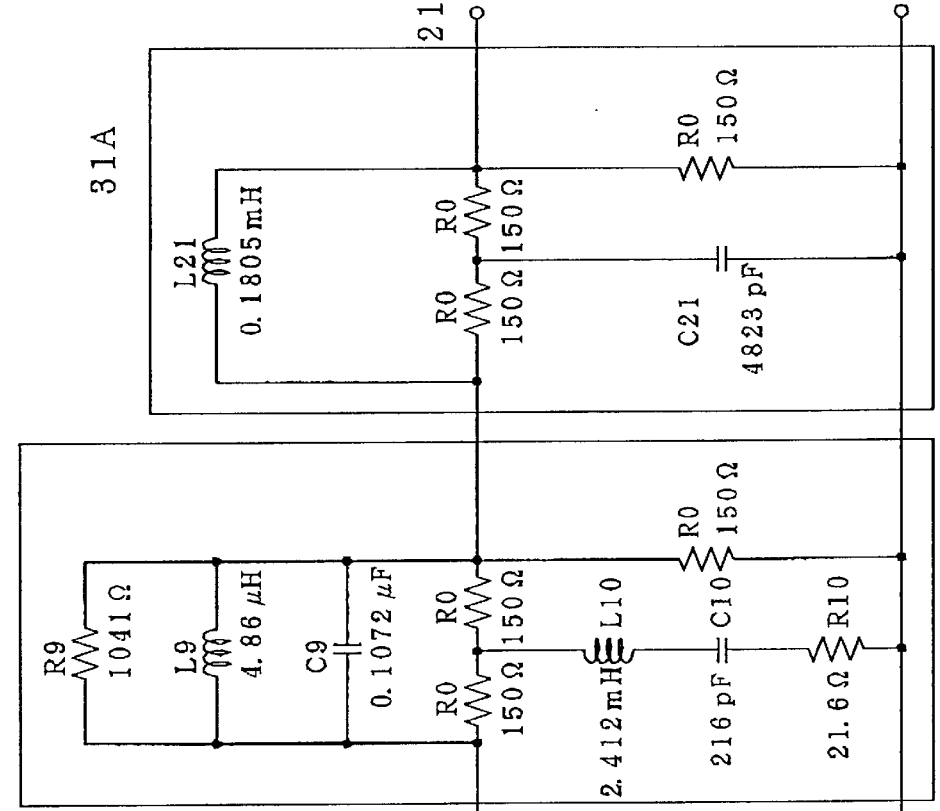
FIG. 15 is a circuit diagram of an analog filter of Example 4 of the second embodiment.
Figure 15:
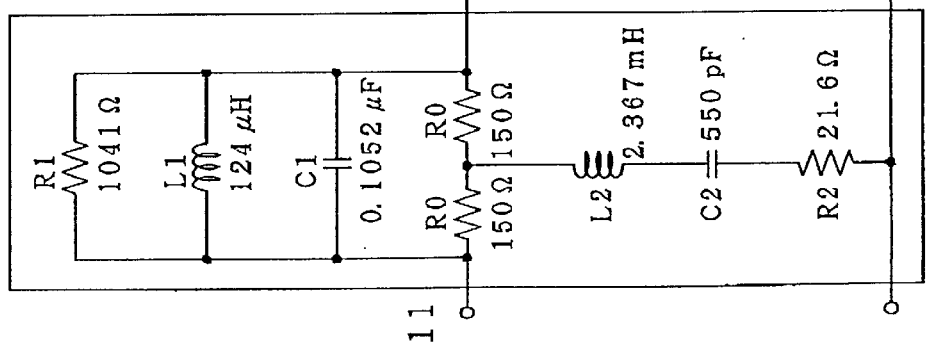

15, a low pass filter circuit 31A is added at the output of the last band elimination filter 16A of Example 1. The low pass filter 31A comprises resistors R0, a coil L21, and a capacitor C21. The cutoff frequency of the low pass filter 31A is around 200 kHz, which is almost five times the sampling frequency. The circuit values are shown in FIG. 15.

Figure 16:
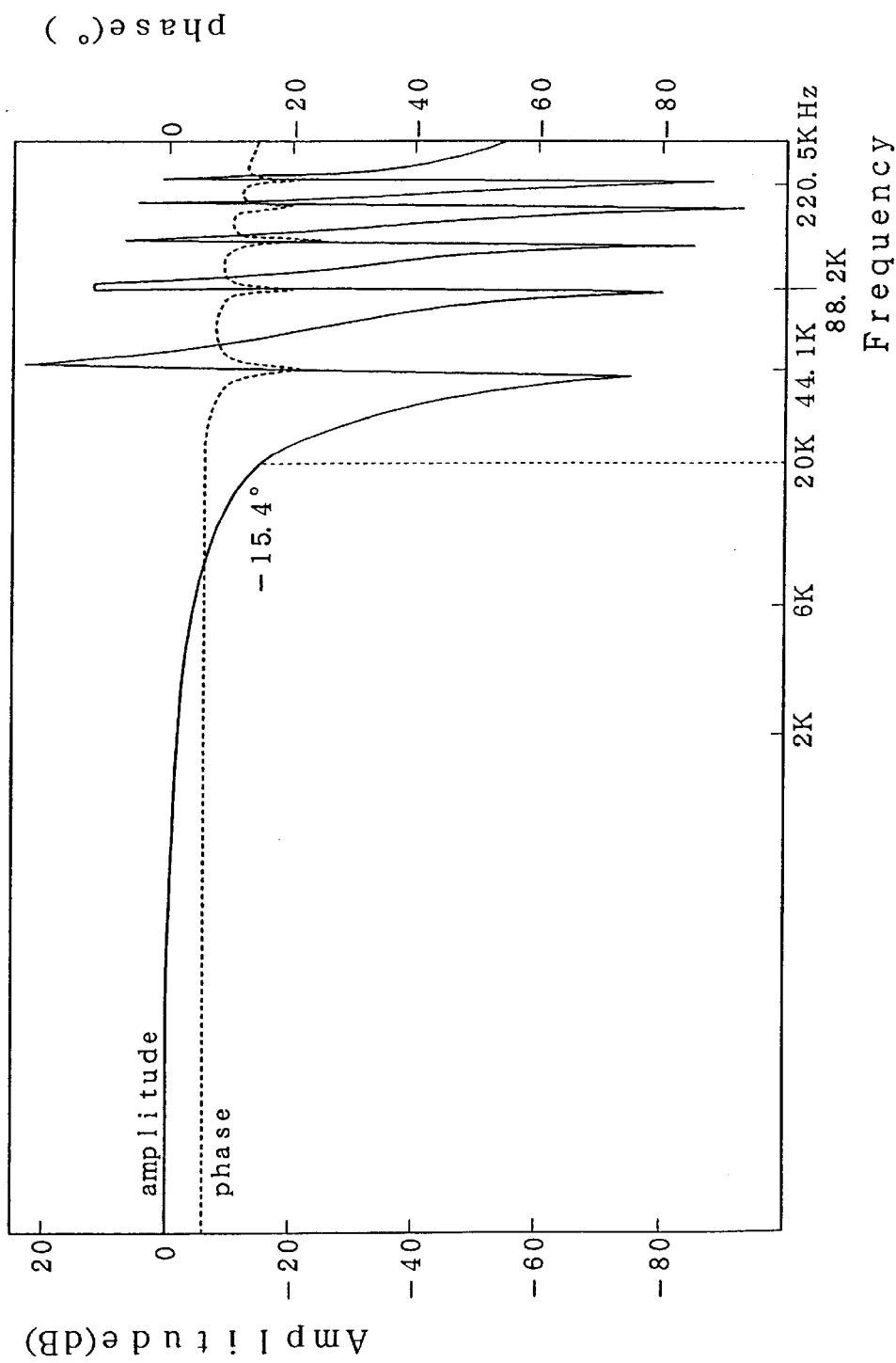
FIG. 16 is a graph of the frequency and phase characteristics of the analog filter of Example 4.

FIG. 16 shows the characteristics of this example. The amplitude characteristic is sufficiently low around the sampling frequency and frequencies of the integral multiples thereof. The higher the frequency is, the lower the amplitude is. With regard to the phase characteristic, the phase does not largely fluctuate up to 40 kHz, and the phase shift is small below 20 kHz, and only −15.4° at 20 kHz. Thus, the phase characteristic is remarkably improved as compared with conventional analog filters.

The characteristic of the low pass filter is determined on the basis of the frequency characteristics connected after a buffer amplifier or a main amplifier. If the cutoff frequency of the low pass filter is low, it may cause the same problems as in the conventional filters. Therefore, the cutoff frequency of the low pass filter is preferably selected to be at least two times higher than the sampling frequency and it can be determined on the basis of the number of band elimination filters.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An analog filter connected to a digital to analog converter, which converts a digital signal sampled at a specified sampling frequency $f_s$ to an analog signal for a digital audio system, comprising:
  a number n of band elimination filters having cutoff frequencies of $f_s \pm \Delta f$, $2f_s \pm \Delta f$, $3f_s \pm \Delta f$, . . . $nf_s \pm \Delta f$, respectively, where n is a natural number and is at least 2, for eliminating upper and lower side bands of the harmonic components of the sampling frequency.

2. An analog filter according to claim 1, wherein said band elimination filters are constant resistor passive filters connected in series.

3. An analog filter according to claim 1, wherein said band elimination filters are resonance circuits connected in series.

4. An analog filter according to claim 1, wherein said band elimination filters are state valuable type active filters, and said active filters are connected to each other.

5. An analog filter according to claim 1, wherein said frequency $\Delta f$ is less than 1 kHz.

6. An analog filter according to claim 1, wherein said specified sampling frequency is an over sampling frequency.

7. An analog filter connected to a digital to analog converter, which converts a digital signal sampled at a specified sampling frequency $f_s$ to an analog signal for a digital audio system, comprising:
  a number n of band elimination filters having the cutoff frequencies of $f_s \pm \Delta f$, $2f_s \pm \Delta f$, $3f_s \pm \Delta f$, . . . $nf_s \pm \Delta f$, respectively, where n is a natural number; and
  a low pass filter which has a cutoff frequency of at least two times higher than said sampling frequency.

8. An analog filter according to claim 7, wherein said band elimination filters are constant resistor passive filters connected in series.

9. An analog filter according to claim 7, wherein said band elimination filters are resonance circuits connected in series.

10. An analog filter according to claim 7, wherein said band elimination filters are state valuable type active filters, and said active filters are connected each other.

11. An analog filter according to claim 7, wherein said frequency $\Delta f$ is less than 1 kHz.

12. An analog filter according to claim 7, wherein said specified sampling frequency is an over sampling frequency.

13. An analog filter according to claim 7, wherein said low pass filter is a filter of at most a third order filter.

14. An audio amplifier for digital audio system, comprising:
  an analog filter connected to a digital to analog converter, which converts a digital signal sampled at a specified sampling frequency $f_s$ to an analog signal for a digital audio system, comprising:
  a number n of band elimination filters having cutoff frequencies of $f_s \pm \Delta f$, $2f_s \pm \Delta f$, $3f_s \pm \Delta f$, . . . $nf_s \pm \Delta f$, respectively, where n is a natural number; and
  an audio amplifying circuit which connects to an output terminal of said analog filter circuit, and amplifies an audio signal.

15. An audio amplifier for digital audio system, comprising:
  an analog filter connected to a digital to analog converter, which converts a digital signal sampled at a specified sampling frequency $f_s$ to an analog signal for a digital audio system, comprising:
  a number n of band elimination filters having the cutoff frequencies of $2f_s \pm \Delta f$, $3f_s \pm \Delta f$, . . . $nf_s \pm \Delta f$, respectively, where n is a natural number; and
  a low pass filter which has a cutoff frequency of at least two times higher than said sampling frequency; and
  an audio amplifying circuit which connects to an output terminal of said analog filter circuit, and amplifies an audio signal.

* * * * *